United States Patent [19]

Ishitani

[11] Patent Number: 5,677,226
[45] Date of Patent: Oct. 14, 1997

[54] METHOD OF MAKING INTEGRATED CIRCUITS

[75] Inventor: Akihiko Ishitani, Tokyo, Japan

[73] Assignee: NEC Corporation, Tokyo, Japan

[21] Appl. No.: 503,204

[22] Filed: Jul. 17, 1995

Related U.S. Application Data

[62] Division of Ser. No. 25,289, Mar. 2, 1993, abandoned.

[30] Foreign Application Priority Data

Mar. 2, 1992 [JP] Japan ................................ 4-44282

[51] Int. Cl.[6] .......................... H01L 21/70; H01L 27/00
[52] U.S. Cl. .................. 437/60; 437/52; 437/DIG. 919; 257/295
[58] Field of Search .............. 437/52, 60, DIG. 919; 257/295

[56] References Cited

U.S. PATENT DOCUMENTS

| | | | |
|---|---|---|---|
| 4,990,463 | 2/1991 | Mori | 437/52 |
| 5,397,748 | 3/1995 | Watanabe et al. | 437/52 |
| 5,514,904 | 5/1996 | Onga et al. | 257/627 |
| 5,524,092 | 6/1996 | Park | 365/145 |
| 5,530,279 | 6/1996 | Yamamichi et al. | 257/310 |
| 5,543,644 | 8/1996 | Abt et al. | 257/295 |
| 5,583,068 | 12/1996 | Jones, Jr. et al. | 437/52 |

*Primary Examiner*—Charles L. Bowers, Jr.
*Assistant Examiner*—Lynne A. Gurley
*Attorney, Agent, or Firm*—Helfgott & Karas, P.C.

[57] ABSTRACT

The invention provides an integrated circuit including a capacitor provided with a silicon nitride film formed on a lower electrode of a polycrystalline silicon film by a rapid thermal nitridation method, a $BaTiO_3$ film formed on the silicon nitride film and an upper electrode. The above capacitor structure can prevent the formation of a silicon oxide layer at the interface between the polycrystalline silicon film and the $BaTiO_3$, and thus has high capacitance.

4 Claims, 3 Drawing Sheets

METHOD OF MAKING INTEGRATED CIRCUITS

CROSS REFERENCE TO RELATED APPLICATION

This application is a division of application Ser. No. 08/025,289 filed Mar. 2, 1993 now abandoned.

BACKGROUND OF THE INVENTION

1. Field of the Invention

This invention relates to an integrated circuit and in more particular to structure of an insulating film of a capacitor which is required in a superhigh integrated circuit, e.g. a memory, logic or the like.

2. Description of the Related Art

In order that superhigh integrated circuit devices have sufficient soft error resistance, it is necessary that capacitors are capable of storing a large quantity of electric charges even if they are highly-integrated fine capacitors. Therefore, it is necessary to thin an insulating film enough to compensate for fineness of the capacitor. If a silicon oxide film is used as the insulating film, it is difficult to form a thin silicon oxide film having a uniform film thickness on a polycrystalline silicon film to constitute a lower electrode and the silicon oxide film having average thickness of about 10 nm is inside the limits in practical applications. If a silicon nitride film is used instead of the silicon oxide film, leak electric current increases when the thickness of the silicon nitride film is made to be about 4 nm or less if the thickness is expressed in terms of reduced thickness of the silicon oxide film and thus the resulting capacitor is not practical use and useful. Therefore, in order to attain even thinner film thickness in terms of reduced thickness of silicon oxide film, application of materials with high dielectric constants to the capacitor has been studied.

As an example of the high-dielectric materials, there are used ferroelectric materials such as perovskite type oxides, e.g. $BaTiO_3$ and $SrTiO_3$, and ilmenite type oxides, e.g. $LiNbO_3$, which are represented by the following formula: $ABO_3$. It is known that these oxides have the dielectric constants ranging from 100 to 10000 in the form of the single composition and solid solution composition as mentioned above. The thin film made from these materials is extremely advantageous to minuteness of the capacitor. In this respect, several studies have been performed very formerly. For instance, I. H. Pratt has reported that $BaTiO_3$ films formed by sputtering and heat-treating had dielectric constants ranging from 16 to 1900 (refer to Proceedings of the IEEE, Vol. 59, No. 10, October 1971, pp. 1440 to 1447). In experiments carried out by I. H. Pratt, metals were used as an electrode material. However, for the recent superhigh integrated circuits, polycrystalline silicon is widely used as the electrode material. Accordingly, if the better thin film of the above-mentioned ferroelectric materials can be formed on the polycrystalline silicon film, it is useful and advantageous to minuteness of the capacitors in the superhigh integrated circuit devices.

However, for instance, W. B. Pennebaker has reported that a silicon oxide film about 10 nm thick was formed between a thin film of a high-dielectric material and a polycrystalline silicon film when the thin film of the high-dielectric material was formed on the polycrystalline silicon film (refer to "RF Sputtered Strontium Titanate Films", IBM Journal of Research and Development, November 1969, pp. 686 to 695, particularly pp. 687 to 688). As can be seen from in this paper, an interfacial layer, i.e. a silicon oxide layer, had a low dielectric constant and as a result the thin film having high dielectric constant formed on the polycrystalline silicon film had increasingly lowered effective dielectric constant. Thus, the advantage of using the material with the high-dielectric constant is almost lost. As the other paper which is similar to the above-mentioned paper, there can be seen a paper concerning $BaTiO_3$ of Janda K. G. Panitz et al., Journal of Vacuum Science and Technology, Vol. 16, No. 2, pp. 315 to 318 (1979), particularly p. 316.

If the film of the $ABO_3$ type material having high dielectric constant is formed directly on the polycrystalline silicon film, the polycrystalline silicon film is oxidized to form an oxide silicon film at the interface between the polycrystalline silicon film and the high-dielectric film. When the silicon oxide film having low dielectric constant is formed, effective capacitance of the capacitor is fixed by the silicon oxide film. Even if the film of any material having high dielectric constant is formed on the silicon oxide film, it is impossible to fabricate the capacitor having sufficient capacitance value.

SUMMARY OF THE INVENTION

It is an object of this invention to provide an integrated circuit provided with a capacitor having high capacitance value and obtained by sandwiching a silicon nitride film between a polycrystalline silicon film and an $ABO_3$ type composite oxide to thereby prevent oxidation of the polycrystalline silicon film.

The above object of the invention is accomplished by providing an integrated circuit comprising a lower electrode including a polycrystalline silicon film formed on a semiconductor substrate, a multilayered insulating film including silicon nitride and $ABO_3$ (A is Sr, Ba or Li; B is Ti or Nb; and O is oxygen) type composite oxide films formed on the lower electrode, and an upper electrode formed on the multilayered insulating film.

DETAILED DESCRIPTION OF THE PREFERRED EMBODIMENTS

Figure 1:
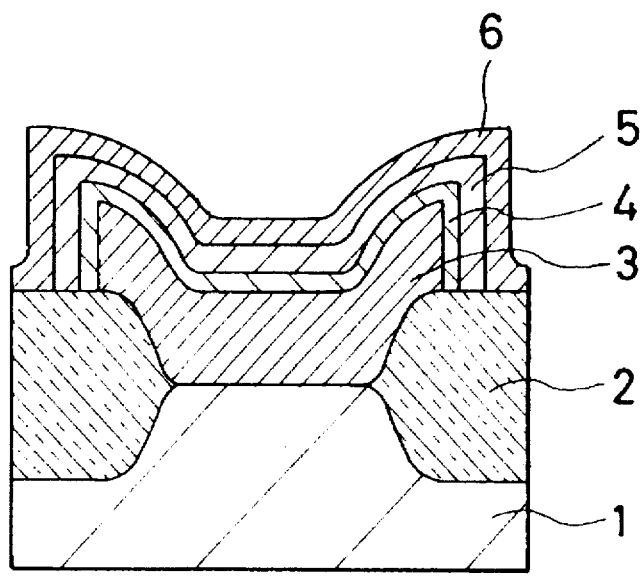
FIG. 1 is a partially and schematically cross-sectional view of a capacitor according to an embodiment of this invention.

According to this invention, a silicon nitride film is formed by directly nitriding a polycrystalline silicon film or is grown on the surface of the polycrystalline silicon film free of a natural oxide film according to a chemical vapor deposition (hereinafter referred to as CVD) method. The silicon nitride film thus obtained is quite different from a conventional silicon nitride film. The silicon nitride film formed by the above-mentioned methods has stoichiometric composition and is quite different from the conventional silicon nitride film as can be confirmed by X-ray photoelectron spectroscopy (XPS or ESCA). Chemical shift of silicon atoms in the conventional silicon nitride film always exhibits larger values than those of silicon atoms in the silicon nitride film in this invention because of being affected by the natural oxide film formed on the polycrystalline silicon film and silicon oxide formed when being introduced into a furnace.

The silicon nitride film having the stoichiometric composition is very stable and thus serves as a stopper for diffusion of oxygen atoms. If the silicon nitride film is formed on the polycrystalline silicon film serving as a lower electrode, the polycrystalline silicon film is not oxidized when an $ABO_3$ film is formed at the subsequent step. However, the silicon nitride film formed by a conventional CVD method does not have such action. The reason is caused by a growth mechanism of the silicon nitride film as mentioned below.

When the silicon nitride film is formed by using ammonia and silane as source gases, silylene is first generated as a product in a CVD reactor. The silylene is adsorbed to the surface of the polycrystalline silicon film serving as a base by shift of electric charges and consequently the surface of the polycrystalline silicon film is terminated by hydrogen atoms. The silylene is reacted with the surface silicon-hydrogen bond so that it is inserted into the bond. After elimination reaction of the hydrogen molecule, the surface silicon atom having an $sp^2$-like composite orbit is left. The silicon atom is reacted with ammonia so that it is inserted into ammonia. By repeating such reactions, the silicon nitride film is grown. As mentioned above, the silicon nitride film is grown on the polycrystalline silicon film or the silicon nitride film. The detailed growth mechanism has been reported in a paper of A. Ishitani et al., Extended Abstract of the 22nd Conference on Solid State Devices and Materials, pp. 187 to 190, 1990, the disclosure of which is hereby incorporated by reference herein.

In the practical fabrication method of superhigh integrated circuits, however, the natural oxide film is always formed on the surface of the polycrystalline silicon film. In addition, when a silicon wafer is introduced into the CVD reactor, the silicon oxide film 2 to 3 nm thick is formed on the surface of the polycrystalline silicon film directly before depositing the silicon nitride film by the air introduced into the reactor or the oxygen or water contained in the injected gases. According to the conventional CVD method, therefore, the silicon nitride film is formed on the silicon oxide film but not on the polycrystalline silicon film. In this case, the silicon nitride film is grown by first generating three-dimensional nucleus of silicon on the silicon oxide film and then forming silicon nitride on the surface of the silicon. Consequently, an insulating film of the capacitor which is formed on the polycrystalline silicon film comprises the natural oxide film on the polycrystalline silicon film, the silicon-rich silicon nitride film and the silicon nitride film from the point of view of the microscopic world. The natural oxide film and the silicon-rich silicon nitride film have the sum thickness of about 5 nm. Thus, in order to form the silicon nitride film serving as the stopper, in the multilayered insulating film formed by the conventional fabrication method, the sum film thickness of about 10 nm or more is needed. In this structure, even if a film of a material having high dielectric constant is formed on the insulating film, it is impossible to obtain the capacitor having satisfactory capacitance since the effective dielectric constant is fixed by the dielectric constant of the multilayered film.

However, if the silicon nitride film having the stoichiometric composition according to this invention is used, the film serves as the stopper even if the thickness is of the order of 2 nm and further the natural oxide film does not exist between the silicon nitride film and the polycrystalline silicon film. Therefore, if the insulating film structure according this invention is used, the lower electrode comprising the polycrystalline silicon film is not oxidized and thus characteristics of the material having high dielectric constant can be utilized almost as they are.

Next embodiments of this invention will be described with reference to drawings.

FIG. 1 shows a cross-sectional view of a capacitor according to an embodiment of this invention, in which a capacitive insulating film comprising a thin film of an $ABO_3$ type composite oxide and a silicon nitride film is used. As shown in FIG. 1, a field oxide film 2 and a lower electrode 3 comprising a polycrystalline silicon film are formed on a silicon substrate 1 and a capacitive insulating film comprising a silicon nitride film 4 and a film 5 of $BaTiO_3$ which is of the $ABO_3$ type composite oxide is formed thereon. And, an upper electrode 6 comprising a polycrystalline silicon film is formed thereon. For the lower electrode, a Ti-Pt film or a Pt-Ta film may be used.

The fabrication method of the capacitor will be described in more detail with reference to the drawings.

First, the field oxide film 2 about 600 nm thick is formed on the silicon substrate 1 having a (100) plane orientation in prescribed position by local oxidation of silicon (LOCOS). Then the polycrystalline silicon film is formed on the whole surface thereof by the CVD method. The polycrystalline silicon film in this embodiment has a thickness of about 100 nm. The thickness is controlled corresponding to a stored amount of electric charge which is required in designing circuits. As the polycrystalline silicon film becomes thick, the stored amount of electric charge increases but exposure margin in photolithography is reduced. Then the polycrystalline film is doped with phosphorus of high concentration by an ion implantation process and then the polycrystalline silicon film with low resistance is patterned into a prescribed pattern to form a lower electrode 3 at an element region.

The surface of the lower electrode 3 thus formed is covered by a natural oxide film. On the surface of the polycrystalline silicon film doped with phosphorus of a high level, a specially thicker natural oxide film is formed. When the natural oxide film exists, the amount of electric charge to be stored is reduced because of low dielectric constant. Incidentally, even if the natural oxide film is removed by any method and if a film of the $ABO_3$ type composite oxide is formed directly on the polycrystalline silicon film, the polycrystalline silicon film is oxidized in the capacitor fabrication process to form a thick silicon oxide film at the interface between the polycrystalline silicon film and the composite oxide film. Therefore, by protecting the polycrystalline silicon film with the silicon nitride film 4, the formation of the natural oxide film must be prevented and also the oxidation of the polycrystalline silicon film must be prevented in the process for fabricating the capacitor by using the $ABO_3$ type composite oxide film.

Figure 2:
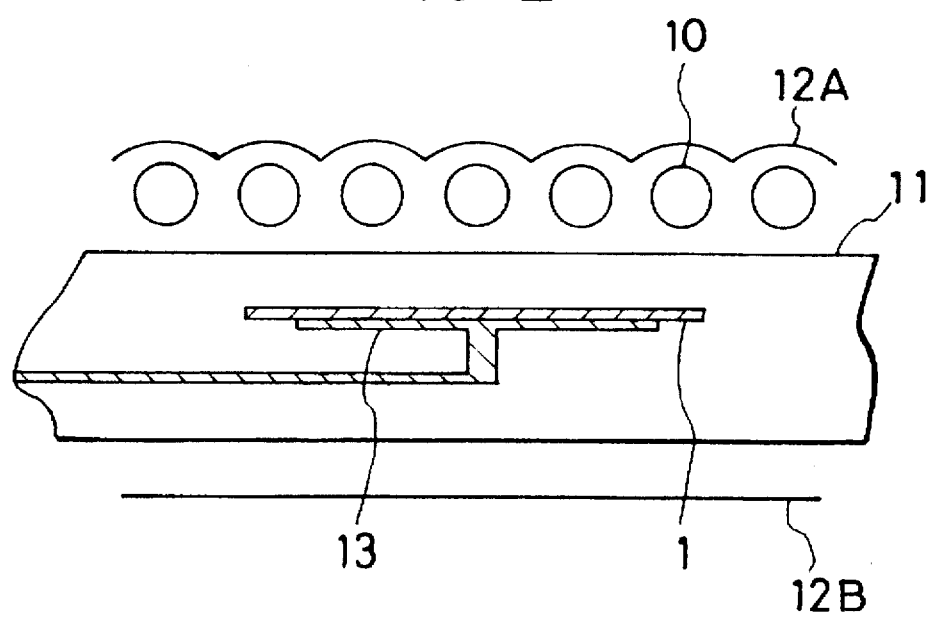
FIG. 2 is a partially and schematically sectional view of a lamp annealing furnace used in a fabrication of the capacitor according to the embodiment of this invention.
Figure 3:
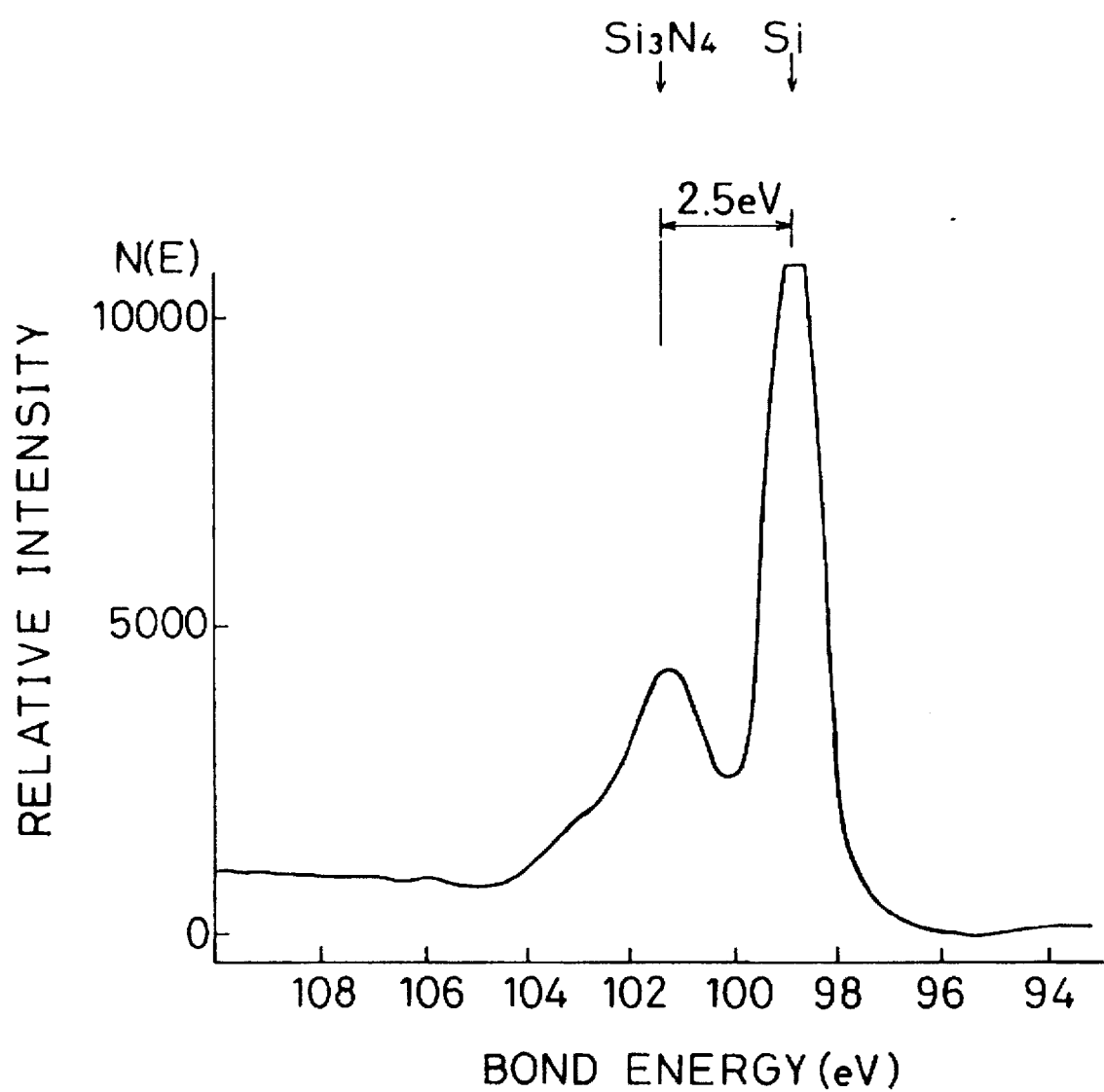
FIG. 3 is a diagram showing X-ray photoelectron spectroscopic spectrum obtained from a silicon nitride film and silicon of a substrate in the embodiment of this invention.

For this end, in this embodiment, the silicon substrate 1 provided with the field oxide film and the polycrystalline silicon film is disposed on a holder 13 in a lamp annealing furnace wherein a quartz reactor 11 surrounded with reflector banks 12A and 12B is heated with halogen lamps 10 as shown in FIG. 2, and the lower electrode 3 on the substrate 1 is nitride in an atmosphere of ammonia at 850° C. for 60 seconds. The silicon nitride film 4 about 2 nm thick is formed in the prescribed position between the natural oxide film and the lower electrode 3 by the above-mentioned operational procedures. Namely, according to the procedures, the silicon nitride film 4 is formed at the interface between the natural oxide film and the polycrystalline silicon film. An X-ray photoelectron spectroscopic spectrum of the silicon nitride film thus formed is shown in FIG. 3.

The silicon nitride film formed by the conventional CVD method has chemical shift of 2.9 eV in ESCA, whereas the silicon nitride film in this embodiment has chemical shift of 2.5 eV in ESCA which is identical to that of silicon nitride having stoichiometric composition. The chemical shift varies corresponding to an amount of oxygen to be contaminated in the silicon nitride film. Unless oxygen is contaminated therein, the silicon nitride film exhibits chemical shift of 2.5 eV. 100% silicon oxide exhibits chemical shift of 3.2 eV. The dielectric constant is lowered as the amount of oxygen to be contaminated becomes large. In addition, oxygen is easily diffused into the film as the amount of oxygen to be contaminated becomes large, thus the polycrystalline silicon film as the lower electrode is oxidized in the process for fabricating the capacitor by using the $ABO_3$ type composite oxide to thereby form the silicon oxide film at the interface.

The relation between the the chemical shift corresponding to the amount of oxygen to be contaminated and the formation of the silicon oxide film at the interface was examined by changing the temperatures when the silicon nitride film is formed by lamp annealing. It was observed that when the chemical shift was up to 2.7 eV, the silicon oxide film was not formed at the interface in the capacitor fabrication process carried out at temperatures not more than 900° C. In addition, the relation between the thickness of the silicon nitride film and the formation of the silicon oxide film at the interface was examined, with results that no silicon oxide film was formed at the interface if the silicon nitride film is about 0.5 nm thick in case of the chemical shift of 2.5 eV and if the silicon nitride film is about 3 nm thick in case of the chemical shift of 2.7 eV.

It is preferred that the chemical shift of the silicon nitride film ranges from 2.5 to 2.7 eV of the high energy side with a silicon atom in silicon single crystal as its center.

Figure 4:
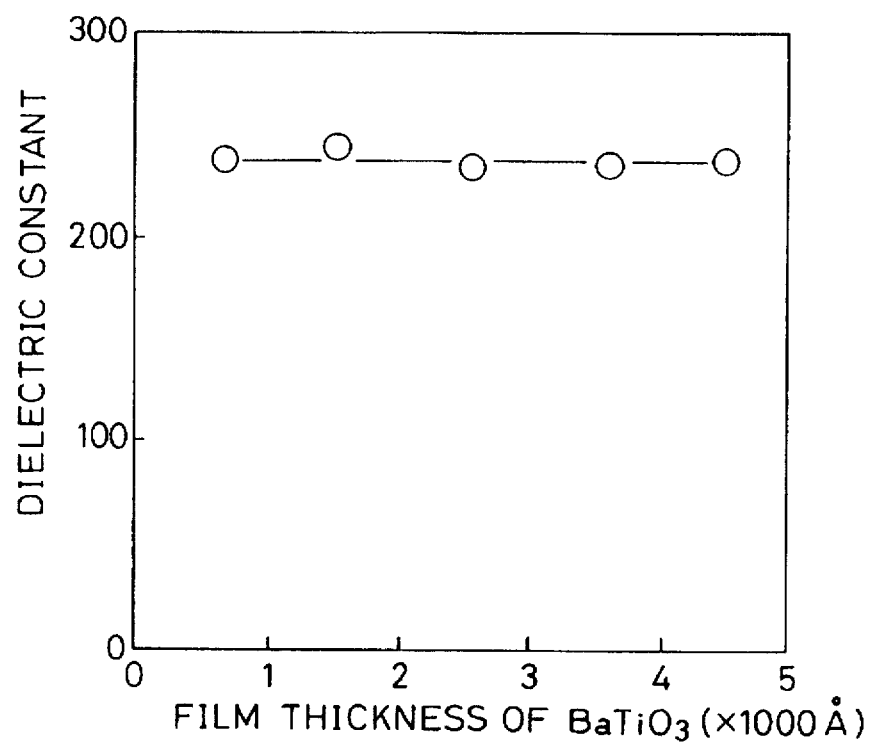
FIG. 4 is a diagram showing effective dielectric constants of a multilayered insulating film in the embodiment of this invention.

Thereafter the natural oxide film on the surface of the silicon nitride film 4 was removed by wet etching to form the $BaTiO_3$ film 5 as a thin film of the material having high dielectric constant. Of course, the thin film may be an $SrTiO_3$ film or an $LiNbO_3$ film in place of the $BaTiO_3$ film. Then the upper electrode 6 comprising the polycrystalline silicon film was formed by the CVD method and ion implantation method. In the case that the $BaTiO_3$ film 5 was used for the high-dielectric layer, the relation between a thickness of the $BaTiO_3$ film 5 and the effective dielectric constant was examined, with results shown in FIG. 4. The $BaTiO_3$ film was formed using a target having stoichiometric composition by a radio frequency magnetron sputtering method. The film was formed in an Ar—$O_2$ mixed gas under gas pressure of $1\times10^{-2}$ Torr at substrate temperatures ranging from 400° to 500° C. The $BaTiO_3$ film thus obtained had effective dielectric constant keeping about 240 constant without depending on the film thickness. It is appreciated that the layer having low dielectric constant was not formed at the interface.

Figure 5:
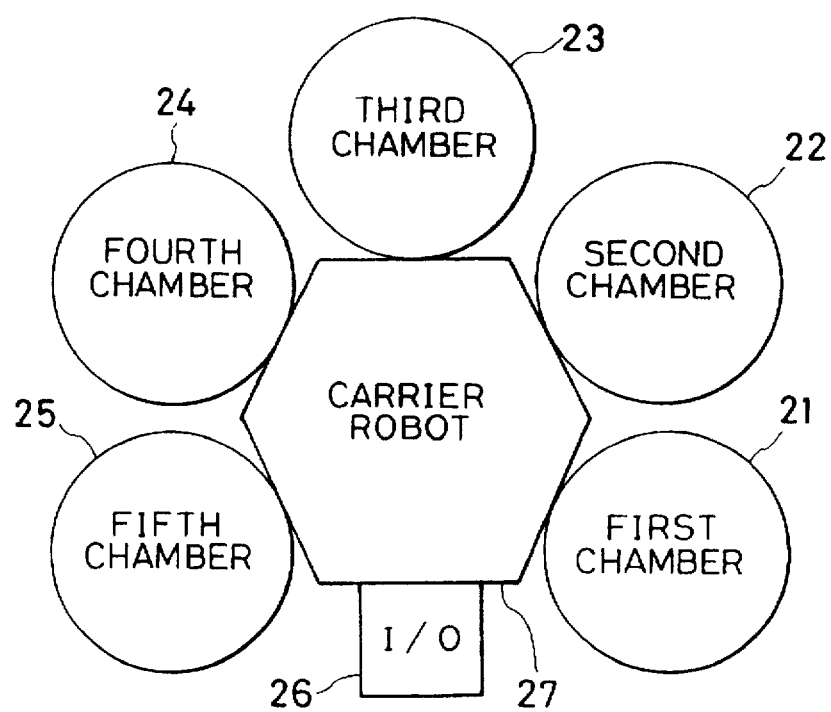
FIG. 5 is a block diagram of a continuous growth apparatus for use in another embodiment of this invention.

In the above-mentioned embodiment, the silicon nitride film 4 free of oxygen was formed by the lamp annealing method. However, the silicon nitride film can be also formed by the CVD method using an apparatus shown in FIG. 5. The drawing shows a block diagram of a continuous growth apparatus which is another apparatus for fabricating the capacitor of the embodiment of this invention.

A specimen, i.e. a substrate provided with a field oxide film and a polycrystalline silicon film, is introduced from an input/output port (I/O) 26 and fed to each of first to fifth chambers 21 to 25 in order by means of a carrier robot 27. In the first chamber 21, a natural oxide film formed on the surface of the polycrystalline silicon film is removed by using anhydrous hydrogen fluoride gas. Then the specimen is carried into the second chamber 22 without being exposed to the atmosphere and the silicon nitride film is formed by the CVD method. Thereafter, in the third chamber 23, the film of the material having high dielectric constant is formed thereon. Then, in the fourth chamber 24, the polycrystalline silicon film is deposited thereon. If the atmosphere during carrying is made to be under vacuum or an inactive gas to thereby prevent the formation of the natural oxide film, the capacitor having the structure shown in FIG. 1 can be obtained even if the silicon nitride film for the capacitor is formed by the CVD method. Furthermore, the fifth chamber 25 is used to form a rapid thermal nitridation film (RTN film) and metal film.

As discussed above, according to this invention, by using the multilayered insulating film comprising the thin $ABO_3$ type composite oxide film and the silicon nitride film, it is possible to suppress the formation of the low-dielectric layer at the interface of the lower electrode comprising the polycrystalline silicon film. Therefore, it is possible to obtain integrated circuits provided with the capacitor having high effective dielectric constant and large capacitance.

While this invention has been particularly described with reference to the preferred embodiments thereof, it will be understood by those skilled in the art that the foregoing and other changes may be made therein without departing from the spirit and scope of the invention.

What is claimed is:

1. A method of forming an integrated circuit, comprising the steps of:

forming a lower electrode including a polycrystalline silicon film on a semiconductor substrate;

forming a multilayered insulating film including a silicon nitride film at an interface between a natural oxide film on said polycrystalline silicon film and said polycrystalline silicon film;

wet etching to remove said natural oxide film;

forming $ABO_3$ type composite oxide films on said silicon nitride film, wherein A is Sr, Ba or Li; B is Ti or Nb; and O is oxygen; and forming an upper electrode on said multilayered insulating film.

2. A method of forming an integrated circuit according to claim 1, wherein said multilayered insulating film is formed by nitriding said lower electrode.

3. A method of forming an integrated circuit according to claim 1, wherein said multilayered insulating film is formed by nitriding said lower electrode in an atmosphere of ammonia.

4. A method of forming an integrated circuit according to claim 1, wherein said multilayered insulating film is formed from said lower electrode by lamp annealing process.

* * * * *